United States Patent
Huber et al.

(10) Patent No.: US 8,350,567 B2
(45) Date of Patent: Jan. 8, 2013

(54) PRE-ADJUSTABLE SMD COILS FOR HIGH CURRENTS

(75) Inventors: Klaus Huber, Effeltrich (DE); Stefan Pott, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 475 days.

(21) Appl. No.: 12/649,425

(22) Filed: Dec. 30, 2009

(65) Prior Publication Data
US 2010/0164497 A1 Jul. 1, 2010

(30) Foreign Application Priority Data
Dec. 30, 2008 (DE) .......................... 10 2008 063 312

(51) Int. Cl.
*G01V 3/00* (2006.01)

(52) U.S. Cl. ........................................................ 324/309
(58) Field of Classification Search ........... 324/300–322
See application file for complete search history.

(56) References Cited

U.S. PATENT DOCUMENTS
7,088,104 B2 * 8/2006 Bottomley .................... 324/328
2009/0021261 A1 1/2009 Chmielewski et al.

FOREIGN PATENT DOCUMENTS
EP 0 962 946 12/1999

* cited by examiner

*Primary Examiner* — Dixomara Vargas
(74) *Attorney, Agent, or Firm* — Schiff Hardin LLP

(57) ABSTRACT

In a device and method to install a coil in a circuit, the coil is installed on a substrate and the inductance value of the coil installed on the substrate is adjusted with a test circuit board. The substrate is then installed in the circuit. This enables an efficient installation of the coil.

19 Claims, 2 Drawing Sheets

PRE-ADJUSTABLE SMD COILS FOR HIGH CURRENTS

BACKGROUND OF THE INVENTION

1. Field of the Invention

The present invention concerns methods for installing a coil in a circuit and devices for this purpose.

2. Description of the Prior Art

Magnetic resonance systems for the examination of patients by magnetic resonance tomography are known from, for example, DE 103 142 15 B4.

The front end electronics of the transmission path of a conventional magnetic resonance system (MR system) normally include a series circuit composed of different function units such as, for example, a transmission path crossover switch, a 90° hybrid circuit, a phase shifter and a transmission/reception diplexer. In nearly all of these units, high-current air-core coils formed by silver-plated copper wire are used. In order to be able to ensure correct functioning of the front end electronics, each of these coils should exhibit an inductance value that is predetermined for it within narrow tolerances. Due to unavoidable heat that arises during losses, the components may heat to temperatures of over 100° C. The execution of the coils as through components (i.e. components that proceed through the circuit board) prevents the presence (and thus the use) of continuous mass on the back side of the circuit board and therefore makes cooling of the module more difficult.

It is known for the air-core coils to be soldered into the module as geometrically predefined through components that are subsequently adjusted by pinching (manual corrective deformation of the coils) until the entire front end electronics satisfies its specifications. This is made difficult due to the high integration of function units in the transmission path front end, because measurement interfaces between the sub-units cannot be provided without additional measures. Such interfaces interfere for space reasons as well as due to the damping or additional reactive parasitic elements associated therewith.

Without interfaces a multidimensional optimization exists in which m measurement parameters must be adjusted with n coils, with each coil affects multiple measurement parameters. Overall, the complicated adjustment represents a significant cost factor in such modules.

A simplification of the adjustment or even a complete absence of adjustment can be achieved by the use of narrow-tolerance components at the critical positions. With regard to capacitors, for example, various manufacturers offer their components with tolerances of +−2% or even +−1%.

Such narrow-tolerance modules are not available for the coils made of silver wire. Even with a suitable pre-adjustment of the coils by the manufacturer, for components installed as through components the problem still exists that the originally specified inductance value can be adulterated in the installation of the module due to different insertion depths or mechanical tolerances of the hole spacing.

SUMMARY OF THE INVENTION

It is an object of the present invention to enable efficient and cost-effective installation of coils in a circuit, in particular a circuit of a magnetic resonance apparatus.

The above object is achieved in accordance with the present invention in a method to install a coil in a circuit on a circuit board, including the steps of initially installing the coil on a substrate, testing the inductance of the coil on the substrate before attaching the substrate to a circuit board, and subsequently installing the substrate with the tested coil thereon on a circuit board to incorporate the coil in a circuit of the circuit board.

The above object also is achieved in accordance with the invention by a magnetic resonance system having a circuit formed on a circuit board, the circuit including a coil that is mounted on a substrate, with the coil and the substrate connected to the circuit board as an SMD (surface mounted device).

According to the invention, the adjustment of coils (in particular of an MR front end electronics module) can be significantly simplified; a subsequent adjustment can even be entirely omitted.

In an advantageous through-installation of the coil on the substrate, a sufficient stability of the SMD module results so that it can also be adjusted given wire diameters greater than 1 mm by pinching (corrective deformation) of the coil. A tearing of SMD pads due to forces occurring in the adjustment is also avoided by the through-installation.

In an embodiment of the carrier as an SMD module, a continuous mass surface (and therefore an efficient cooling of the module) is enabled.

Attachment of the coil on the substrate by a rigid connection avoids the connection between the coil and the substrate changes significantly upon soldering of the substrate with the adjusted coil into a circuit.

DESCRIPTION OF THE PREFERRED EMBODIMENTS

Figure 4:
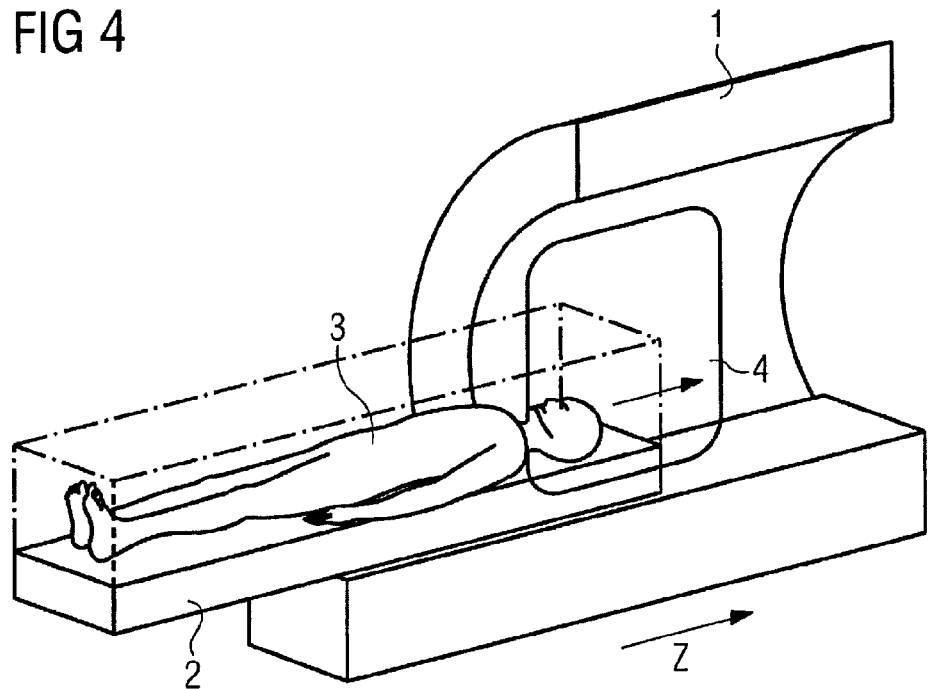
FIG. 4 schematically illustrates a known magnetic resonance tomography system.

FIG. 4 shows a magnetic resonance apparatus 1 with a displaceable patient bed 2, with which a patient 3 is examined. The patient 3 is moved in the patient bed 2 in the Z-direction (i.e. in the axial direction) through the imaging region of the magnetic resonance apparatus 1.

Figure 1A:
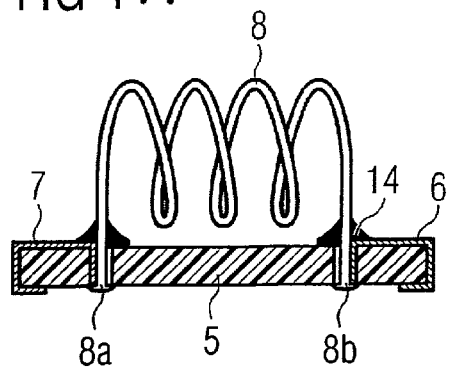
FIGS. 1A and 1B show examples of embodiments of pre-adjustable SMD coils on a substrate carrier.
Figure 1B:
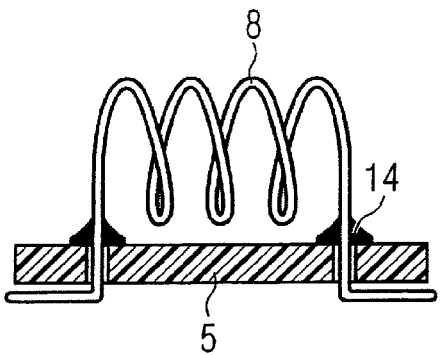

FIGS. 1A and 1B show examples of embodiments of pre-adjustable SMD coils for circuits in the transmission path of a magnetic resonance apparatus 1.

In FIG. 1A, on a substrate 5 made of low-loss material (for example RO4350) the two ends 8a, 8b of a coil 8 that are inserted through the substrate 5 are contacted by soldering. In addition to a solder connection 14 such as that in FIG. 1, a rigid connection can also be used (for example by riveting the coil ends 8a, 8b into recesses of the substrate 5) in order to prevent that the connection between the coil and the substrate from shifting upon soldering of the adjusted coil.

A connection with known SMD pads 6, 7 also can be produced according to the example in FIG. 1B. A connection without SMD pads can also ensue according to the example in FIG. 1B, for example, with curved ends of the coil that can possibly be additionally soldered.

The coil 8 can be mechanically predefined (for example by the coil ends 8a, 8b being folded for the recesses in the substrate) and thermally unloaded before the mounting on SMD substrate 5.

Figure 2:
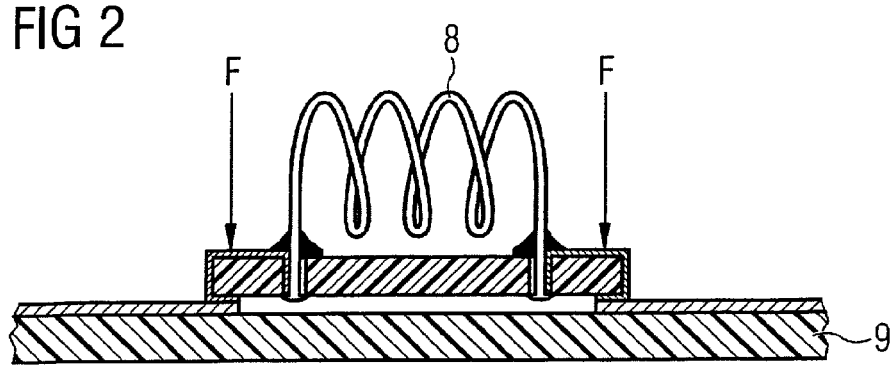
FIG. 2 shows the installation of a substrate of an SMD coil (of the type shown in the embodiment in FIG. 1) in a test version.

The coil 8 installed on the substrate 5 can be adjusted to the desired inductance value in a test circuit 9, for example according to FIG. 2.

The substrate 5 on which the coil 8 is already mounted is here inserted with a force F (for example manually) into clamp contacts of the test circuit located on a test circuit board, and the coil 8 is then tuned in a known manner (for example by pinching); its inductance is thus set to a desired value.

Given use of a suitable test circuit (for example a resonant circuit), tolerances of below 1% could be achieved by such testing. The coil is thereby adjusted, for example with a resonant circuit, so that a no-load operation (phase angle of the input reflection factor=0°) occurs at the input of the resonant circuit.

Figure 3:
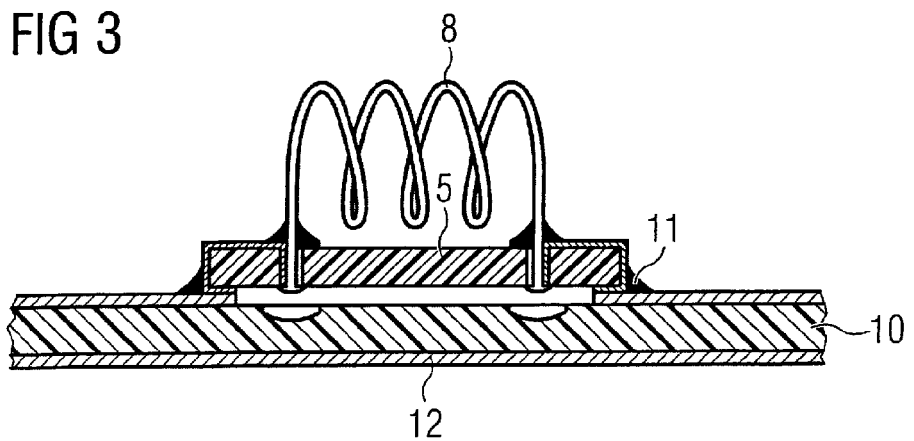
FIG. 3 shows installation of a carrier of an SMD coil in a circuit of an MR apparatus.

FIG. 3 shows a section of a circuit board of a circuit 10 that can be populated with the substrate 5 of the coil 8 (after the adjustment of the coil 8 in the arrangement according to FIG. 2). For example, this can ensue by a solder connection 11 between the substrate 5 of the coil 8 (that is fashioned here as an SMD module) and the circuit 10. Recesses in the form of blind holes 15, 16 can be provided in the circuit board 10. The blind holes produce a safe spacing between the ends 8a, 8b of the coil 8 (in particular given execution according to the right side of FIG. 1) and the circuit board 10. A base metallization 12 on the underside of the circuit 10 forms a continuous mass that can be cooled well.

The adjustment of the front end electronics module can be significantly simplified by the use of mechanically reliable, narrow-tolerance coils; ideally, a subsequent adjustment can even be entirely foregone.

The invention has been described in the context of a coil for the transmission path of an MR system, but it can also be used in other configurations.

Figure 5:
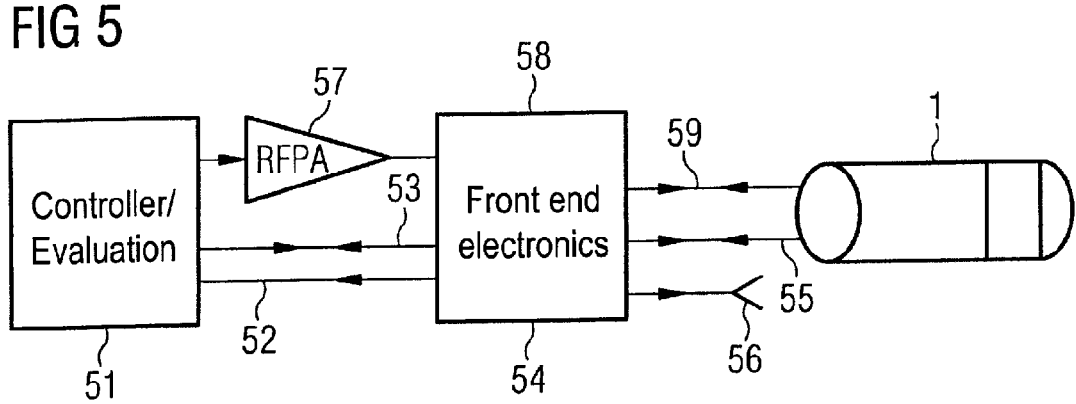
FIG. 5 schematically shows the arrangement of a front end and transmission path in an MR apparatus, as a block diagram.

FIG. 5 schematically shows an arrangement of a front end electronics unit 58 of an MR apparatus 1 and a local transmission coil 56 as a block diagram. Test signals 53 and reception signals of the whole-body resonator and/or of the local transmission coil 56 of the MR apparatus are transferred between a controller with an evaluation device 51 and the front end electronics unit 54, for example. The front end electronic unit 58 is connected with the whole-body resonator 1 via connections 55, 59 to send and to receive.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for installing a coil in a circuit on a circuit board, comprising the steps of:
    installing an inductive coil on a substrate;
    adjusting an inductance value of said coil installed on said substrate, thereby producing an adjusted coil; and
    only after producing said adjusted coil, installing said adjusted coil on said substrate on a circuit board comprising a circuit thereon, to incorporate said adjusted coil in said circuit on said circuit board and thereby producing a circuit board embodying said adjusted coil as a component of said circuit board.

2. A method as claimed in claim 1 comprising adjusting said inductance value of said coil by temporarily installing said substrate with said coil installed thereon in a test circuit board.

3. A method as claimed in claim 1 comprising attaching said coil to said substrate by through-installation of contacts of said coil through said substrate.

4. A method as claimed in claim 1 comprising attaching said coil to said substrate with a rigid connection.

5. A method as claimed in claim 1 comprising thermally unloading said coil before installing said coil on said substrate.

6. A method as claimed in claim 1 comprising employing an SMD circuit board as said substrate.

7. A method as claimed in claim 1 comprising attaching said coil to said substrate by soldering.

8. A method as claimed in claim 1 comprising installing said circuit board in a magnetic resonance system.

9. A method as claimed in claim 8 wherein said magnetic resonance system comprises a transmission path for a signal that is radiated to an examination subject in the magnetic resonance system, and installing said circuit board in said transmission path.

10. A method as claimed in claim 1 comprising employing a high-current, air-core coil as said coil.

11. A method as claimed in claim 10 comprising forming said high-current, air-core coil from silver-plated copper wire.

12. A magnetic resonance system comprising:
    a magnetic resonance data acquisition unit comprising a circuit on a circuit board;
    an inductive coil on a substrate;
    said inductive coil having an inductance value adjusted for said coil installed on said substrate, thereby producing an adjusted coil; and
    said adjusted coil on said substrate being installed on said circuit board to incorporate said adjusted coil in said circuit on said circuit board as an already-adjusted coil.

13. A magnetic resonance system as claimed in claim 12 wherein said coil is attached to said substrate by through-installation of contacts of said coil through said substrate.

14. A magnetic resonance system as claimed in claim 12 wherein said coil is attached to said substrate with a rigid connection.

15. A magnetic resonance system as claimed in claim 12 wherein said substrate forms an SMD circuit board.

16. A magnetic resonance system as claimed in claim 12 wherein said coil is attached to said substrate by soldering.

17. A magnetic resonance system as claimed in claim 12 comprising a transmission path for a signal that is radiated to an examination subject in the magnetic resonance data acquisition unit and wherein said circuit board is installed in said transmission path.

18. A magnetic resonance system as claimed in claim 12 wherein said coil is a high-current, air-core coil.

19. A magnetic resonance system as claimed in claim 18 wherein said high-current, air-core coil is formed from silver-plated copper wire.

\* \* \* \* \*